United States Patent
Assmann

(10) Patent No.: US 7,481,789 B2
(45) Date of Patent: Jan. 27, 2009

(54) METHOD FOR SEGMENTING A MEDICAL DATA SET

(75) Inventor: Stefan Assmann, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 575 days.

(21) Appl. No.: 11/200,320

(22) Filed: Aug. 9, 2005

(65) Prior Publication Data

US 2006/0056692 A1    Mar. 16, 2006

(30) Foreign Application Priority Data

Aug. 9, 2004    (DE) ............... 10 2004 038 670

(51) Int. Cl.
*A61M 29/00*    (2006.01)
*G06K 9/00*    (2006.01)

(52) U.S. Cl. .................... 604/96.01; 382/128

(58) Field of Classification Search ............. 382/106, 382/128, 129, 130, 131, 132, 133, 154, 168, 382/173, 181, 189, 260, 274, 286, 291, 305, 382/100; 604/96.01; 600/407; 324/307, 324/309; 378/20, 21

See application file for complete search history.

(56) References Cited

U.S. PATENT DOCUMENTS

| | | | |
|---|---|---|---|
| 6,195,409 B1 * | 2/2001 | Chang et al. | 378/20 |
| 6,275,035 B1 * | 8/2001 | Debbins et al. | 324/307 |
| 6,882,149 B2 * | 4/2005 | Nitz | 324/309 |
| 7,274,810 B2 * | 9/2007 | Reeves et al. | 382/128 |
| 7,346,381 B2 * | 3/2008 | Okerlund et al. | 600/407 |
| 7,356,367 B2 * | 4/2008 | Liang et al. | 600/407 |
| 2003/0194119 A1 | 10/2003 | Manjeshwar et al. | |

OTHER PUBLICATIONS

Automatisierte Segmentierung und Volumetrie Bispektraler Magnetrestonanz-Bilddaten des Gehirns, Published Doctoral Dissertation of Michael Friedlinger at University of Karlsruhe, Feb. 4, 1999.
"Automatic 2D Segmentation of the Left Ventricle in Tagged Cardiac MRI Using Motion Information," Milles et al. IEEE Int. Symp. on Biomedical Engineering: Macro to Nano, Apr. 15-18, 2004, vol. 1, pp. 153-156.

* cited by examiner

*Primary Examiner*—Seyed Azarian
(74) *Attorney, Agent, or Firm*—Schiff Hardin LLP

(57) ABSTRACT

In a method for segmentation of a medical data set, the segmentation is implemented using markings, the markings being set in the generation of the data set.

10 Claims, 2 Drawing Sheets

METHOD FOR SEGMENTING A MEDICAL DATA SET

BACKGROUND OF THE INVENTION

1. Field of the Invention

The present invention concerns a method for segmenting a medical data set.

2. Description of the Prior Art

Segmenting of data sets is necessary in many situations for making a diagnostic finding from medical data sets. A relevant region of a data set is thereby particularly emphasized, or non-relevant regions of a data set are removed. A medical finding is thereby made easier for a physician. To make a finding in the context of a magnetic resonance examination, the physician, for example, can limit the relevant region within a data set by setting a number of markings. The segmentation is implemented using these markings. Thus, for example, the segmenting of a coronary artery proceeds where the markings are placed along the coronary artery and thus mark its course within a three-dimensional data set. After the segmentation, the coronary artery can be disposed, for example, in a pseudo-3D representation, whereby the vessel structure is easily recognizable to the physician. This method of segmentation, however, is complicated for the physician since the data set (generally composed of many partial images) must be manually analyzed to set the markings.

SUMMARY OF THE INVENTION

An object of the present invention is to provide a simple method for segmentation of data sets.

This object is achieved in accordance with the invention by a method wherein, in an overview data set, at least one marking is generated with which a data set is measured. The markings limit a relevant region within the overview data set. The segmentation of the measured data set is implemented using the generated markings. The evaluation of the data set (generally composed of many partial images), which is necessary for resetting the markings, is not necessary due to the reuse of the markings. The segmentation thus can be implemented simply and quickly.

In an embodiment of the method, a coronary artery is segmented from a data set. Here a manual setting of markings is complex due to the generally complicated course of the coronary artery in three dimensions. A number of data sets would have to be viewed in order to be able to apply the markings.

DESCRIPTION OF THE PREFERRED EMBODIMENTS

To examine a coronary artery by magnetic resonance, it is initially necessary to position and orient a slice block to be measured. This slice block is selected so that the coronary artery to be examined, or the part of the coronary artery to be examined, lies within the slice block. For this purpose, in a first method step S2 three overview images in which the coronary artery is to be presented are acquired at various positions. In a second method step S4, each image is shown on a monitor. During the display, a marking is manually generated in each image by an examining physician via an input unit, for example a computer mouse. In a third method step S6, a slice block is determined that optimally maps the region limited by the markings. The markings are stored for further use in a method step S8 parallel to this. The measurement of the determined slice block ensues in a fourth method step S10. The segmentation of the coronary artery to be examined ensues in a fifth method step S12. For this purpose, the markings generated before the measurement and that reproduce the course of the coronary artery are used. A redefinition of the points by the physician is therefore not needed, so the overall workflow is made easier. In a sixth method step S14, the segmented coronary artery is shown on a monitor so that a detailed diagnosis can be made. All measurement data not belonging to the coronary artery are not shown.

Figure 1:
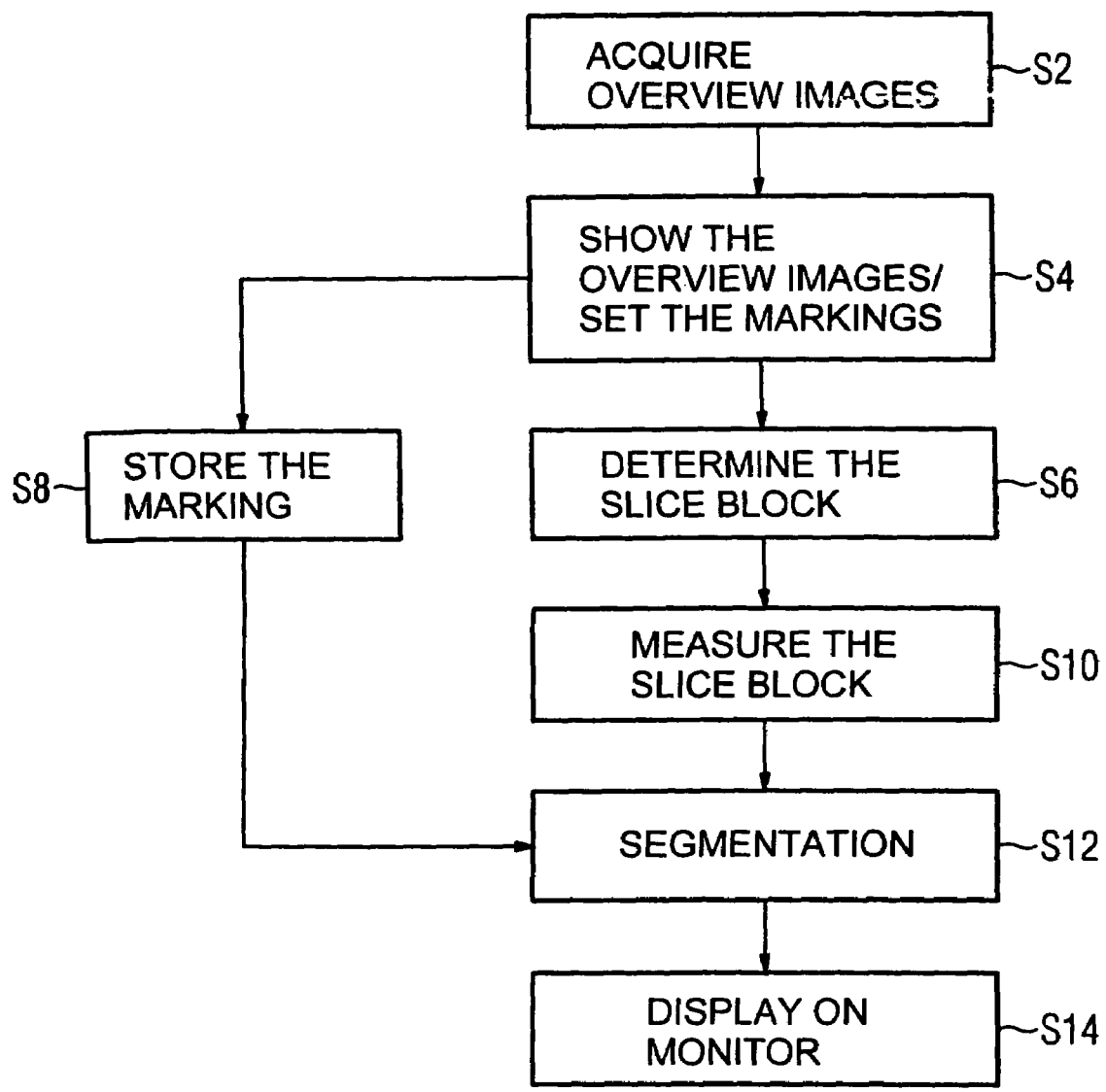
FIG. 1 is a flowchart of an embodiment of a method for segmentation of a coronary artery in accordance with the invention.
Figure 2:
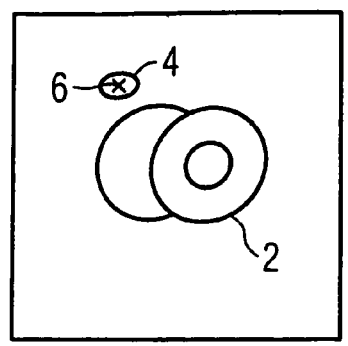
FIG. 2 through 4 schematically show overview images for explaining the inventive method.
Figure 3:
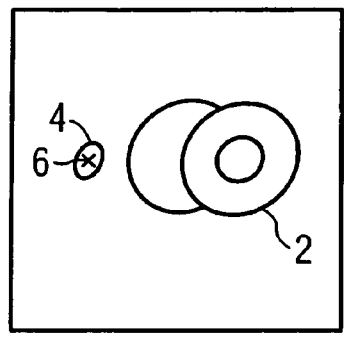
Figure 4:
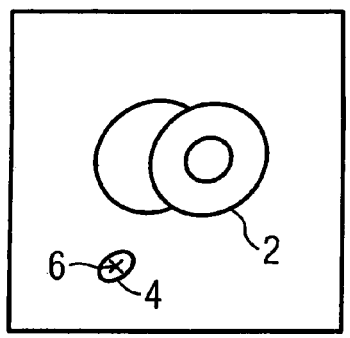

Three overview images are schematically shown in FIGS. 2, 3 and 4. A cross-section through a human heart 2 and a section through the coronary artery 4 are respectively shown therein. The overview images have been acquired at various positions in the heart region, so that the coronary artery 4 running around the heart appears at a different point on each overview image. The corresponding points of the section between the coronary artery 4 and the respective overview image have been provided by the doctor with a respective marking 6. A slice block that contains the coronary artery 4 is automatically determined using the set markings in the method described above. A segmentation is implemented in the measured slice block to enable further diagnoses, which is described in the following.

Figure 5:
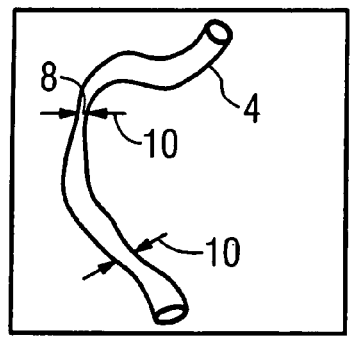
FIG. 5 schematically shows a coronary artery segmented according to the invention.

A coronary artery 4 is schematically shown in FIG. 5 after the segmentation. It exhibits a stenosis (thus a narrow point) in its course. The dimensions of the stenosis can be quantified using the segmented data. The diameter of the coronary artery at various points can thereby be determined, which here is clarified by two double arrows 10. Narrow points are shown emphasized after the analysis.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for segmenting a medical data set, comprising the steps of:
    acquiring an overview data set of a subject non-contemporaneously with generating at least one marking on said overview data set, by storing said overview data set in a memory, and retrieving said overview data set from said memory to generate said at least one marking;
    subsequently acquiring a diagnostic data set, different from said overview data set, from the subject using said at least one marking; and
    segmenting said diagnostic data set using the same at least one marking that was generated on said overview data set.

2. A method as claimed in claim 1 comprising acquiring said overview data set substantially contemporaneously with generating said at least one marking on said overview data set.

3. A method as claimed in claim 1 comprising storing said at least one marking in a memory.

4. A method as claimed in claim 1 comprising generating three points as said at least one marking on said overview data set.

5. A method as claimed in claim 1 comprising acquiring said diagnostic data set by magnetic resonance.

6. A method as claimed in claim 5 comprising employing an overview data set representing a plurality of partial images of said subject.

7. A method as claimed in claim 6 comprising generating at least one marking on each of said plurality of partial images of said overview data set.

8. A method as claimed in claim 5 comprising acquiring said diagnostic data set as a slice block of the subject.

9. A method as claimed in claim 8 comprising determining at least one of a position and orientation of said slice block using said at least one marking.

10. A method as claimed in claim 5 comprising acquiring data representing an image of the coronary artery of the subject as said diagnostic data set.

* * * * *